Metcalf

United States Patent [19]

[11] 4,242,634

[45] Dec. 30, 1980

[54] ELECTRONIC MULTIPLYING CIRCUITS

[75] Inventor: Eric Metcalf, Ropley, England

[73] Assignee: Enertec, Montrouge, France

[21] Appl. No.: 29,808

[22] Filed: Apr. 13, 1979

[30] Foreign Application Priority Data

May 6, 1978 [GB] United Kingdom ............... 18129/78

[51] Int. Cl.[3] ............................................ G01R 21/06

[52] U.S. Cl. ................................ 324/142; 307/225 R; 328/160

[58] Field of Search ........................ 324/142; 328/160; 307/225; 364/483, 841

[56] References Cited

U.S. PATENT DOCUMENTS

| | | | |
|---|---|---|---|
| 2,661,457 | 12/1953 | Boast et al. | 324/142 |
| 3,432,650 | 3/1969 | Thompson | 328/160 X |
| 3,440,441 | 4/1969 | Ley | 328/160 X |
| 3,500,200 | 3/1970 | Woodhead | 324/142 |
| 3,906,246 | 9/1975 | Okada | 328/160 X |
| 4,053,832 | 10/1977 | Nelson | 324/142 |

*Primary Examiner*—Stanley T. Krawczewicz
*Attorney, Agent, or Firm*—W. R. Sherman; Kevin McMahon; Mikio Ishimaru

[57] ABSTRACT

An electronic multiplying circuit, primarily intended for use in an electronic watthour meter, comprises a variable-transconductance multiplier of the type comprising two emitter-coupled pairs of transistors, the collectors of one pair being cross-coupled with the collectors of the other pair. In order to permit the effective polarity of one of the input signals to the multiplier to be reversed from time to time for drift correction purposes, this input signal is applied to a semiconductor switching circuit, which applies it alternately to the respective bases of a further emitter-coupled pair of transistors. The collectors of the transistors of this further pair are connected in series with the coupled emitters of respective ones of the emitter-coupled pairs in the variable-transconductance multiplier.

11 Claims, 3 Drawing Figures

ELECTRONIC MULTIPLYING CIRCUITS

Figure 1A:
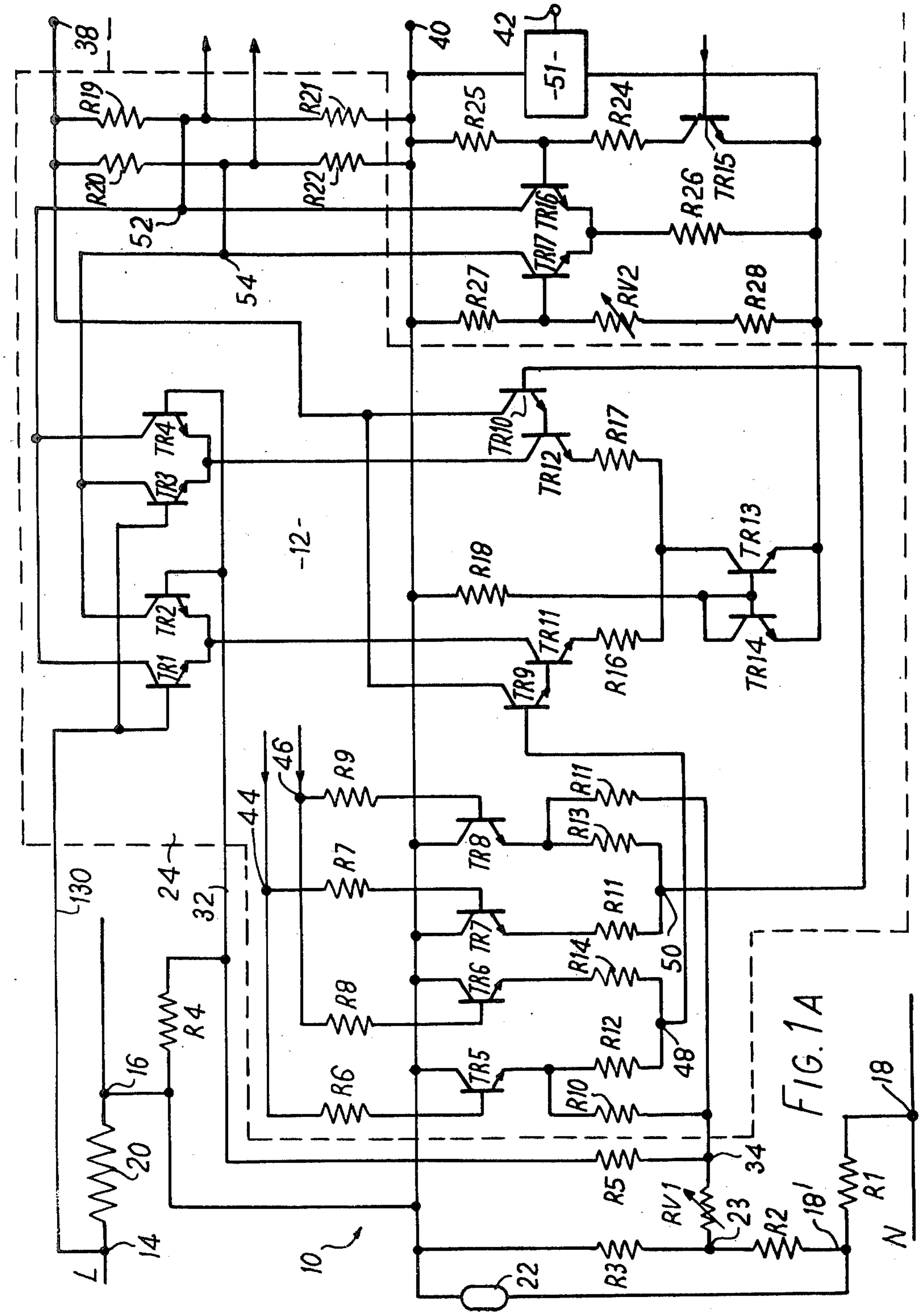

This invention relates to electronic multiplying circuits, and is more particularly but not exclusively concerned with such a circuit which includes a variable-transconductance multiplier and is especially suitable for use in an electronic watthour meter.

In our co-pending U.S. Patent Application Ser. No. 905,450, there is disclosed an electronic watthour meter for connection in an electrical power distribution circuit consisting of a live wire and a neutral or reference wire, the meter employing a variable-transconductance multiplier. The multiplier is connected to receive and multiply together a first input signal representative of the current flowing in the live wire and a second input signal representative of the voltage between the wires, so as to produce a signal dependent upon the product of the two input signals, and forms part of an integrated circuit implemented using large scale integration (LSI) techniques. The product-dependent signal produced by the multiplier is digitised, and the digital signals thus produced are accumulated to produce the meter output signal.

In order to alleviate problems due to drift and offset signals normally associated with variable-transconductance multipliers, the effective polarity of one of the input signals and the polarity with which the digital signals are accumulated are periodically and simultaneously reversed.

It is an object of the present invention to provide an electronic multiplying circuit in which the aforementioned polarity reversal of one of the input signals is effected in a particularly convenient and advantageous manner, which multiplying circuit is suitable for implementation by LSI techniques.

According to the present invention, there is provided an electronic multiplying circuit for multiplying together a first input signal and a second input signal, the multiplying circuit comprising:

a multiplier having a first input for receiving the first input signal, a second input, and an output;

an emitter coupled pair of transistors, the collector of at least one of said transistors being coupled to the second input of the multiplier; and a semiconductor switching circuit having an input for receiving the second input signal and first and second outputs coupled to the respective bases of said transistors, said switching circuit being operable to switch between first and second states in which the input of the switching circuit is alternately coupled to the respective bases of said transistors;

whereby, in operation, the magnitude of the signal applied by said emitter-coupled pair of transistors to the second input of the multiplier varies in dependence upon the second signal, and an output signal which varies in dependence upon the product of the first and second signals is produced at the output of the multiplier, the sense of the respective variations reversing with changes of the switching circuit between its first and second states.

Figure 1B:
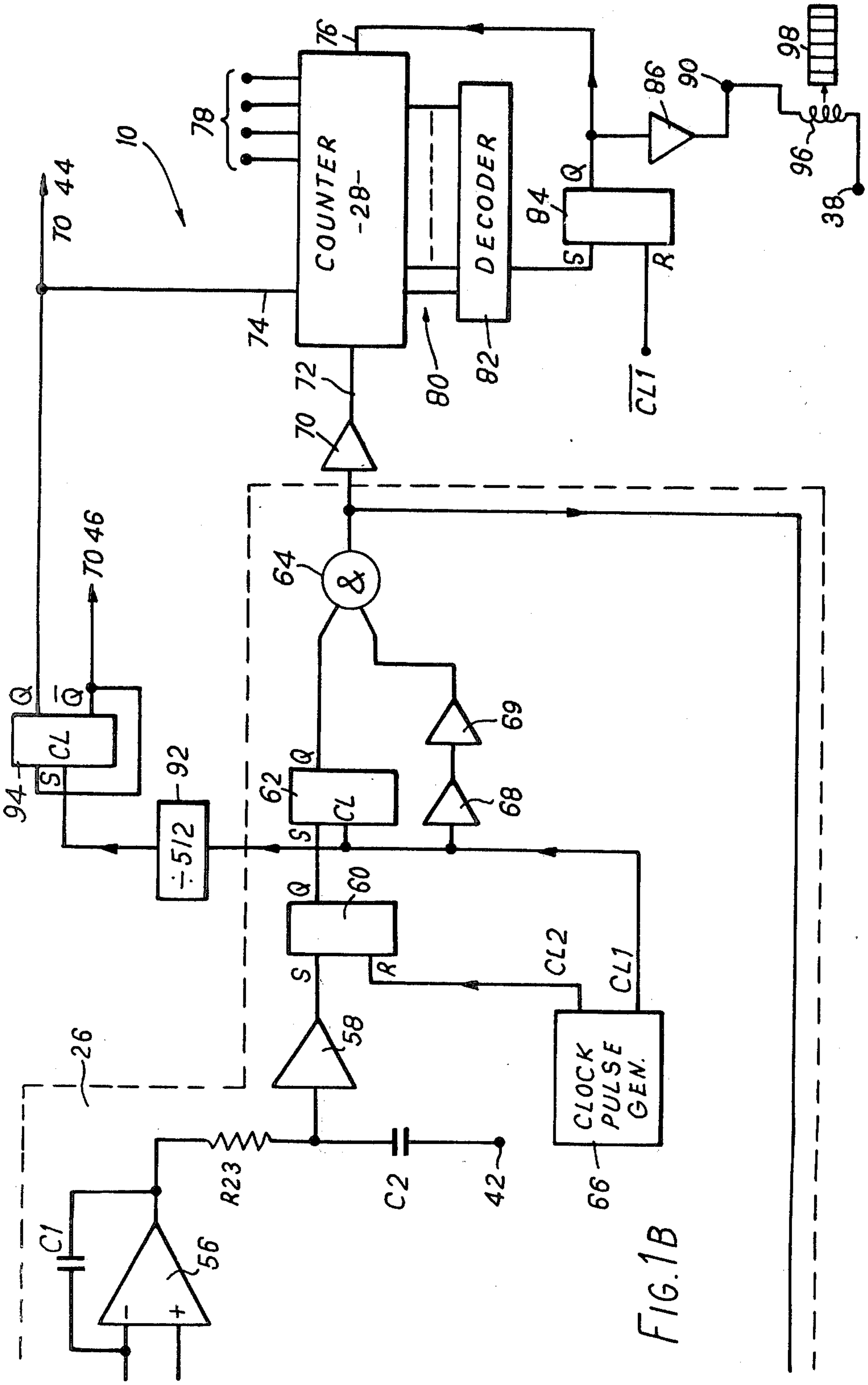
Figure 2:
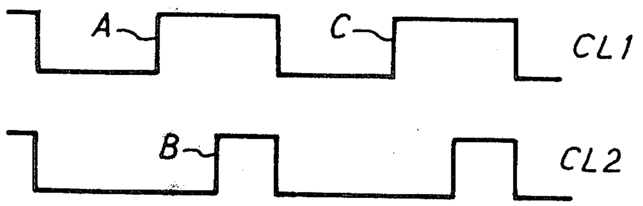

The invention will now be described, by way of example only, with reference to the accompanying drawing, of which:

FIGS. 1A and 1B show a somewhat simplified circuit diagram of an electronic watthour meter based on a large scale integrated circuit, the integrated circuit including a variable-transconductance multiplier in accordance with the present invention; and FIG. 2 illustrates some waveforms which appear in the integrated circuit of FIG. 1.

The electronic watthour meter of FIGS. 1A and 1B is indicated generally at 10, while the integrated circuit upon which the meter 10 is based is indicated generally at 12. The meter 10 is shown connected to a two wire electrical power distribution circuit consisting of a live wire L and a neutral or reference wire N. The meter 10 comprises a plastics casing (not shown) containing two current terminals 14, 16, which are series connected in the live wire L, and a third terminal 18, which is connected to the neutral wire N. A current shunt 20 is series connected between the terminals 14, 16 and thus produces between the terminals 14, 16 a voltage $V_x$ whose instantaneous magnitude is proportional to the instantaneous magnitude of the current I flowing in the live wire L. The terminal 18 is connected via a relatively low value resistor R1 to a terminal 18', which is surge-protected by being connected to the terminal 16 via a surge-limiting varistor 22 of the ZnO type. The terminal 18' is also connected to the terminal 16 via a potential divider comprising two further resistors R2 and R3, so that a voltage $V_y$ proportional to the voltage V between the wires L and N is produced at the junction 23 between the resistors R2 and R3.

The circuit 12 basically comprises a variable-transconductance multiplier 24 arranged to produce an output voltage whose instantaneous magnitude is dependent upon the product of the instantaneous magnitudes of the voltages $V_x$ and $V_y$, a voltage-to-frequency converter 26 arranged to convert this product-dependent voltage to a pulse train whose instantaneous frequency varies with the product-dependent voltage, and a reversible counter 28 arranged to count the pulses of the pulse train.

To this end, the circuit 12 has two inputs 30, 32 respectively coupled to the terminals 14, 16 to receive the voltage $V_x$ (the former input being coupled directly, the latter via a very low value resistor R4) and a third input 34 connected to the junction 23 between the resistors R2, R3, via a variable resistor RV1, to receive a signal proportional to the voltage Vy. A further resistor R5 is connected between the terminals 32 and 34: the purpose of the resistors R4 and R5 will become apparent hereinafter.

The circuit 12 also has positive and negative power supply inputs 38 and 42 which are connected to receive positive and negative DC power supply voltages with respect to a zero volt power supply input 40 connected to the terminal 16: the way in which these power supply voltages are generated is described in more detail in the aforementioned co-pending patent application.

The variable-transconductance multiplier 24 comprises first and second emitter-coupled pairs of NPN transistors TR1, TR2 and TR3, TR4 respectively. The bases of the transistors TR1, TR3 are commoned, and are connected to the input 30 of the circuit 12, while the basis of the transistors TR2, TR4 are also commoned, and are connected to the input 32.

The multiplier 24 also includes a transistor switching (or chopper) circuit comprising four NPN transistors TR5 to TR8, each having its collector connected to the zero volt power supply input 40. The bases of the transistors TR5, TR7 are connected to a common control input point 44 via respective resistors R6, R7, while the bases of the transistors TR6, TR8 are connected to a common control input point 46 via respective resistors R8, R9: the input points 44, 46 are connected to receive 8 Hz antiphase square wave control signals, as will become apparent hereinafter. The emitters of the transistors TR5, TR8 are connected via equal value resistors R10, R11 to the input 34 of the circuit 12, and, via two further resistors R12, R13 equal in value to the resistors R10, R11 to respective chopper output points 48, 50. The emitters of the transistors TR6, TR7 are connected to the points 48 and 50 respectively via equal resistors R14, R15 whose common value is 1.5 times that of the common value of the resistors R10 to R13.

The chopper output points 48, 50 are connected to the bases of respective NPN transistors TR9, TR10, whose collectors are connected to the positive power supply input 38, and whose emitters are connected to the bases of respective NPN transistors TR11, TR12. The transistors TR9, TR11 thus constitute a super alpha pair, as do the transistors TR10, TR12. The collectors of the transistors TR11, TR12 are respectively connected to the commoned emitters of the transistors TR1, TR2 and to the commoned emitters of the transistors TR3, TR4, while their emitters are connected via resistors R16, R17, equal in value to the resistors R10 to R13, to the collector of an NPN transistor TR13. The transistor TR13 has its emitter connected to a negative reference voltage source 51, and is arranged to operate as a constant current source by means of a resistor R18 connected between its base and the zero volt power supply input 40 and an NPN transistor TR14 connected as a diode (i.e. with its collector and base commoned) between the base and emitter of the transistor TR13.

The collectors of the transistors TR1, TR4 are commoned at 52, while the collectors of the transistors TR2, TR3 are commoned at 54, the points 52, 54 being connected via equal resistors R19, R20 to the positive power supply input 38 and via equal resistor R21, R22 to the zero volt power supply input 40. The points 52, 54 also constitute the output of the multiplier 24.

The points 52, 54 are connected to the inverting and non-inverting inputs respectively of a differential amplifier 56, which inputs constitute the input of the voltage-to-frequency converter 26. The output of the amplifier 56 is negative-feedback connected to its inverting input via a capacitor C1 to form an integrator, and is also connected via a resistor R23 to the input of a voltage level detector 58. The input of the detector 58 is connected via a capacitor C2 to the negative power supply input 42, while the output of the detector 58 is connected to the set input of a bistable circuit 60. The Q output of the bistable circuit 60 is connected to the set input of a clocked bistable circuit 62, whose Q output is connected to one input of a two-input AND gate 64. The clock input of the bistable circuit 62 and the reset input of the bistable circuit 60 are connected to receive respective clock signals CL1 and CL2 produced by a clock pluse generator 66, and the other input of the AND gate 64 is connected to receive the clock signal CL1 via two cascaded inverters 68, 69. The clock pulse generator includes a crystal controlled oscillator (not shown) having a typical operating frequency of 32768 Hz, and bistable frequency divider circuits and gating circuits (not shown) arranged in a known manner to produce the clock signals CL1 and CL2 at a common frequency, typically 8192 Hz, with waveforms as shown at A and B in FIG. 2.

The output of the AND gate 64 is connected to the base of an NPN transistor TR15 which is connected between the negative reference voltage source 51 and one end of a resistor R24. The other end of the resistor R24 is connected to the base of an NPN transistor TR16, and via a resistor R25 to the zero volt power supply input 40. The emitter of the transistor TR16 is connected to the emitter of an NPN transistor TR17, to form yet another emitter-coupled pair, the commoned emitters being connected via a precision resistor R26 to the negative reference voltage source 51. The base of the transistor TR17 is connected to the zero volt power supply input 40 via a resistor R27 and to the negative reference voltage source 51 via the series combination of a resistor R28 and an adjustable resistor RV2. The collectors of the transistors TR16, TR17 are connected to the inverting and non-inverting inputs respectively of the amplifier 56.

The reference voltage source 51 is of the known band gap reference type, a suitable implementation of such a source being readily derivable, for example, from the bipolar source described in U.S. Pat. No. 3,976,896.

The output of the AND gate 64 constitutes the output of the voltage-to-frequency converter 26, and is connected via a buffer amplifier 70 to the count input 72 of the reversible counter 28. The counter 28 is a 12 bit binary counter of the presettable type, and has an up/-down control input 74, a preset input 76, and a set of inputs 78 to which a digital signal representative of a desired presettable count is permanently applied. The counter 28 also has a set of count outputs 80, which are connected to a decoder 82 arranged to produce an output pulse when the counter reaches a predetermined count. The output of the decoder 82 is connected to the set input of a bistable circuit 84, whose reset input is connected to receive an inverted version of the clock signal CL1, e.g. from the inverter 68. The Q output of the bistable circuit 84 is connected to the preset input 76 of the counter 28, and is also connected, via a buffer amplifier 86, to a terminal 90 which constitutes the output of the circuit 12.

The aforementioned 8 Hz antiphase square wave control signals applied to the input points 44, 46 in the multiplier 24 are derived from the clock signal CL1 via a divide-by-512 frequency divider circuit 92, whose output is connected to the clock input of a clocked bistable circuit 94. The Q output of the bistable circuit 94 is connected to the input point 44 and to the up/-down control input 74 of the counter 28, while the $\overline{Q}$ output of this bistable circuit is connected back to its set input as well as to the input point 46.

To complete the meter 10, the output terminal 90 is connected to one end of a solenoid coil 96 of a conventional solenoid-operated totalising counter 98 of the kind used in some telephone billing recorders: the other end of the solenoid coil 96 is connected to the positive power supply input 38 of the circuit 12.

In operation, the aforementioned voltage $V_x$ produced by the current shunt 20 is applied to the inputs 30, 32 of the multiplier 24, between the respective bases of the transistors TR1, TR2 and between the respective bases of the transistors TR3, TR4. Additionally, the aforementioned voltage $V_y$ is applied to the input 34 of the multiplier 24 via the variable resistor RV1.

The 8192 Hz clock signal CL1 produced by the clock pulse generator 66 is frequency-divided by 512 in the divider circuit 92 to produce a 16 Hz clock signal, which is in turn frequency-divided by two by the bistable circuit 94 to produce at the Q and $\overline{Q}$ outputs of this bistable circuit the aforementioned 8 Hz antiphase square wave control signals. These two antiphase signals are applied to the input points 44, 46 in the multiplier 24, one rendering the transistors TR5, TR7 alternately both conductive and then both nonconductive and the other rendering the transistors TR6, TR8 alternately both conductive and then both nonconductive together but in antiphase with the transistors TR5, TR7. As a result, equally attenuated versions of the voltage $V_y$ alternately appear at the chopper output points 48 and 50 in the multiplier 24, and are applied to the super-alpha transistor pairs TR9, TR11 and TR10, TR12 respectively.

It will be appreciated that these last mentioned transistors together form a differential amplifier, which operates during one half cycle of the 8 Hz antiphase control signal to increase the current flowing in the commoned emitters of the transistors TR1, TR2 while correspondingly decreasing the current flowing in the commoned emitters of the transistors TR3, TR4, and which operates during the other half cycle of the 8 Hz antiphase control signals to decrease the current flowing in the commoned emitters of the transistors TR1, TR2 while correspondingly increasing the current flowing in the commoned emitters of the transistors TR3, TR4, the respective magnitudes of the increases and decreases being in each case substantially equal and dependent upon the magnitude of the voltage $V_y$.

These current variations in the transistor pairs TR1, TR2 and TR3, TR4 are effective to vary the respective transconductances of the transistors, so that they tend to produce between their respective commoned collectors (i.e. between the points 52, 54) an output voltage $V_o$ proportional to the product $V_x V_y$, and therefore proportional to the product V.I: however, the polarity of the voltage $V_o$ changes at the end of each half cycle of the 8 Hz antiphase control signals.

The voltage $V_o$ is algebraically combined at the points 52, 54 with an offset voltage which the transistors TR16, TR17 in the voltage-to-frequency converter 26 tend to produce when the transistor TR15 is not conductive. This offset voltage is adjusted by means of the variable resistor RV2 to be negative and larger than the normal full scale positive value of $V_o$, so that the difference voltage applied to the integrator based on the amplifier 56 (i.e. applied to the input of the converter 26) when the transistor TR15 is not conductive is always negative. This difference voltage therefore causes the output of the amplifier 56 to ramp positively, at a rate dependent upon its magnitude, to trigger the detector 58.

The detector 58, when triggered, sets the bistable circuit 60, which in turn conditions the bistable circuit 62 to be set by the next rising edge of the clock signal CL1 (indicated by way of example at A in FIG. 2). The bistable circuit 62 enables the AND gate 64, so that the transistor TR15 is rendered conductive by the same rising edge of the clock signal CL1. The next rising edge of the clock signal CL2, indicated at B in FIG. 2, resets the bistable circuit 60, thus conditioning the bistable circuit 62 to be reset by the next rising edge of the clock signal CL1. The resetting of the bistable circuit 62 disables the AND gate 64, thus rendering the transistor TR15 non-conductive again. The transistor TR15 is therefore rendered conductive for a precisely defined time equal to one half period of the clock signal CL1.

When the resistor TR15 is rendered conductive, it changes the aforementioned offset voltage produced by the transistors TR16, TR17 by a precisely defined amount sufficient to render the aforementioned difference voltage positive and thereby cause the output of the amplifier 56 to ramp negatively to a level below the detection level of the detector 58. Once the transistor TR15 becomes non-conductive again, the sequence of events just described is repeated.

It will be appreciated that the maximum frequency at which the transistor TR15 can be rendered conductive, i.e. the maximum output frequency of the converter 26, is 8192 Hz. The variable resistor RV2 is adjusted such that with zero current flowing in the shunt 20, the output frequency of the converter is about half the maximum frequency, i.e. 4096 Hz. Then, when the current flowing in the shunt is not zero, the resulting voltage $V_o$ which the transistors TR1, TR2 tend to produce changes the aforementioned difference voltage by a corresponding amount, so that the frequency of operation of the transistor TR15 increases or decreases from 4096 Hz in dependence upon whether $V_o$ is negative or positive respectively, and by an amount dependent upon the magnitude of the product V.I. The voltage-to-frequency converter 26 therefore produces at its output (i.e. at the output of the AND gate 64) a pulse signal whose frequency is dependent upon the magnitude of the product V.I.

The pulses of the pulse signal produced by the converter 26 are applied to and counted in the reversible counter 28. It will be recalled that the 8 Hz square wave control signal which is applied to the input point 44 of the multiplier 24 also controls the direction of counting of the counter 28, so that the counter counts upwardly when the transistors TR5, TR7 are conductive and downwardly when the transistors TR6, TR8 are conductive. Thus, since the 8 Hz antiphase control signals also change the polarity of the ratio $V_o/V$, the number N of pulses supplied to the counter 28 during one period of the 8Hz square wave signal commencing at a time $t_1$ is given by $$N = \left[ fo + k \int_{t_1}^{t_1 + T/2} V.I.\, dt \right]_2^T - \left[ fo - k \int_{t_1 + T/2}^{t_1 + T} V.I.\, dt \right]_2^T \quad (1)$$

which simplifies to $$N = \frac{kT}{2} \int_{t_1}^{t_1 + T} V.I.\, dt \quad (2)$$

where:

fo is the frequency of the pulses when I=0;

T is the period of the 8 Hz square wave signals; and k is a constant of proportionality.

Thus the number of pulses counted by the counter 28 is proportional to the time integral of the product V.I.

The counter 28 has a full house count of $2^{12}$, or 4096. However, each time the counter 28 reaches a predetermined count, typically about $\frac{7}{8}$th of its full house count (i.e. a count of 3584), the decoder 82 produces an output pulse which resets the counter, via the bistable circuit 84, to its presettable count, which is typically chosen to be about $\frac{1}{8}$th of its full house count (i.e. a count of 512). Thus although the counter 28 counts both upwardly and downwardly, it can count only upwardly through the predetermined count which produces, via the decoder 82 and the bistable circuit 84, an output pulse at the output terminal 90, i.e. if the counter 28 counts upwardly to a count of 3584 and produces an output pulse, and then immediately counts downwardly, the downward counting will commence from the presettable count of 512. The production of spurious output pulses at the output 90 is thus avoided.

The pulses appearing at the output 90 are counted by the solenoid-operating totalising counter 98, their accumulated total representing the total amount of electrical energy supplied via the wires L and N.

The variable-transconductance multiplier 24 of the circuit 12 has a number of advantages in addition to those advantages of the circuit 12, such as the cancellation of the thermal drift and offsets inherent in the multiplier 24, discussed in the aforementioned U.S. Patent Application Ser. No. 905,450. In particular, the selection of the respective values of the resistors R10 and R17 ensures that:

(a) the input impedance $R_{IN}$ at the input 34 of the multiplier 24 is substantially the same for either possible combination of states of the transistors TR5 to TR8; and (b) more importantly, the output impedance $R_{OUT}$ presented by the chopper output points 48,50 to the respective bases of the transistors TR9, TR10 is also substantially the same for either possible combination of states of the transistors TR5 to TR8. Thus if the value of the resistors R10 to R13, R16 and R17 is r, so that the value of the resistors R14, R15 is 1.5 r, then with the transistors TR5, TR7 conductive, the input impedance $R_{IN}$ is given by $$1/R_{IN} = 1/R10 + 1/(R11 + R13 + R15) = 1/r + 1/3.5r,$$

while with the transistors TR6, TR8 conductive, the input impedance $R_{IN}$ is given by $$1/R_{IN} = 1/R11 + 1/(R10 + R12 + R14) = 1/r + 1/3.5r.$$

Similarly, the output impedance $R_{OUT}$, for example at the chopper output point 48, when the transistors TR5, TR7 are conductive is given by $$R_{OUT}=R12=r$$

and when the transistors TR6, TR8 are conductive is given by $$1/R_{OUT} = 1/R14 + 1(R10 + R11 + R12) = 1/1.5r + 1/3r = 1/r,$$

whence $R_{OUT}=r$.

A further advantage of the multiplier 24 is that undesired common mode signals are substantially reduced not only by use of two emitter-coupled pairs of transistors TR1, TR2 and TR3, TR4 having their collectors cross-coupled, but also by the use of the chopper circuit based on the transistors TR5 to TR8 and the differential amplifier based on the transistors TR9 to TR12 to alternately vary the respective emitter currents of the transistor pairs TR1, TR2 and TR3, TR4 in opposite senses.

The resistors R4 and R5 merely serve to offset the current-representative input voltage $V_x$ very slightly, such that with no power being supplied via the wires L and N, the circuit 12 receives input signals indicative of a very low level negative or reverse power. The counter 28 therefore tends to count downwardly very slowly. However, when the count in the counter 28 reaches a predetermined low value, eg two, the decoder 82 produces a further output signal at an auxiliary output thereof (not shown), which further output signal is also connected to reset the counter 28 to its preset count (without affecting the bistable circuit 84). This arrangement ensures that when no power is being supplied via the wires L and N, even for prolonged periods, the circuit 12 cannot produce output pulses to augment the count in the totalising counter 98.

A number of modifications can be made to the circuit 12 of the meter 10. For example, the operating frequency of the chopper circuit based on the transistors TR5 to TR8 need not be 8 Hz. Further, the resistors R16, R17 need not be equal in value to the resistors R10 to R13, but merely of the same order of magnitude, since this is normally sufficient to ensure good matching of temperature characteristics. Also, the chopper circuit based on the transistors TR5 to TR8 and the differential amplifier based on the transistors TR9 to TR12 can be arranged to reverse the other input signal (i.e. $V_x$) of the transconductance multiplier based on the transistors TR1 to TR4, eg by applying an amplified version of the voltage $V_x$ to the input 34 while applying voltage derived from the voltage $V_y$ between the bases of the transistors TR1, TR2 and TR3, TR4. Moreoever, the variable-transconductance multiplier based on the transistors TR1 to TR4 can be replaced by another kind of multiplier, eg a mark-space multiplier.

I claim:

1. An electronic multiplying circuit for multiplying together a first input signal and a second input signal, the multiplying circuit comprising:

a multiplier having a first input for receiving the first input signal, a second input, and an output;

an emitter-coupled pair of transistors, the collector of at least one of said transistors being coupled to the second input of the multiplier; and a semiconductor switching circuit having an input for receiving the second input signal and first and second outputs coupled to the respective basis of said transistors, said switching circuit being operable to switch between first and second states in which the input of the switching circuit is alternately coupled to the respective bases of said transistors;

whereby, in operation, the magnitude of the signal applied by said emitter-coupled pair of transistors to the second input of the multiplier varies in dependence upon the second signal, and an output signal which varies in dependence upon the product of the first and second signals is produced at the output of the multiplier, the sense of the respective variations reversing with changes of the switching circuit between its first and second states.

2. A circuit as claimed in claim 1, wherein the multiplier comprises a variable-transconductance multiplier.

3. A circuit as claimed in claim 2, wherein the multiplier comprises a second emitter-coupled pair of transistors arranged to receive the first input signal between the respective bases of the transistors thereof, the collector of the said one transistor of the first-mentioned emitter-coupled pair being connected to the coupled emitters of the transistors of said second pair.

4. A circuit as claimed in claim 3, wherein the multiplier further comprises a third emitter-coupled pair of transistors whose respective bases are connected to the respective bases of the transistors of said second pair and whose respective collectors are cross-coupled with the collectors of the transistors of said second pair, the collector of the other transistor of said first mentioned pair being connected to the coupled emitters of said third pair, whereby in operation, the total emitter current of the transistors of said third pair varies in antiphase with the variation in the total emitter current of the transistors of said second pair.

5. A circuit as claimed in claim 1, wherein the semiconductor switching circuit comprises:

first, second, third and fourth switching transistors:

first and second resistances series connected between the input and the first output, the junction between the first and second resistances being connected to a common low impedance point via the first switching transistor;

a third resistance connected in series with the second switching transistor between the first output and said common point;

fourth and fifth resistances series connected between the input and the second output, the junction between the fourth and fifth resistances being connected to said common point via the third switching transistors;

a sixth resistance connected in series with the fourth switching transistor between the second output and said common point;

a first control input for rendering the first and fourth switching transistors conductive together; and a second control input for rendering the second and third switching transistors conductive together;

the values of the resistances being selected such that when the first and fourth switching transistors are rendered alternately both conductive and then both non-conductive, in antiphase with the second and third switching transistors, equally attenuated versions of the second input signal alternately appear at said first and second outputs.

6. A circuit as claimed in claim 5, wherein the first, second, fourth and fifth resistances are all equal in value to each other, and the third and sixth resistances are also equal in value to each other, the common value of the third and sixth resistances being substantially equal to 1.5 times the common value of the first, second, fourth and fifth resistances.

7. A circuit as claimed in claim 6, wherein the respective emitters of the transistors of the said firstmentioned pair are coupled together via seventh and eighth resistances equal in value to each other and of the same order of value as the first, second, fourth and fifth resistances.

8. A circuit as claimed in claim 1, further comprising a constant current source connected to maintain the total emitter current of the transistors of said firstmentioned pair substantially constant.

9. A circuit as claimed in claim 7, further comprising a constant current source connected to maintain the total emitter current of the transistors of said firstmentioned pair substantially constant, and wherein said constant current source comprises a constant-current transistor having its collector connected to the junction between the seventh and eighth resistances.

10. A circuit as claimed in claim 1, wherein the first and second outputs of the semiconductor switching circuit are coupled to the respective bases of the transistors of the said firstmentioned pair via respective emitter-follower transistors, whereby each emitter-follower transistor and its associated transistor of said firstmentioned pair together constitute a super-alpha pair of transistors.

11. An electronic watthour meter adapted to be connected in a multiwire electrical power distribution circuit for producing an output signal related to the electrical energy being supplied via said distribution circuit, the meter including an electronic multiplying circuit in accordance with claim 1 and further comprising means for producing a signal representative of the current flowing in one wire of said distribution circuit and applying said current-representative signal to the multiplying circuit as one of said first and second input signals, and means for producing a signal representative of the voltage between said one wire and another wire of said distribution circuit and applying said voltage-representative signal to the multiplying circuit as the other of said first and second input signals.

* * * * *